United States Patent
Cheung et al.

(10) Patent No.: US 11,316,502 B1
(45) Date of Patent: Apr. 26, 2022

(54) OPEN CONDITION SENSING AND PROTECTION

(71) Applicant: Renesas Electronics America Inc., Milpitas, CA (US)

(72) Inventors: Chun Cheung, Bridgewater, NJ (US); Keerthi Varman Anna Jayaprakash, Edison, NJ (US); Fumihito Hayashi, Takasaki (JP); Yuji Ikeda, Atsugi (JP)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/195,767

(22) Filed: Mar. 9, 2021

(51) Int. Cl.
| | |
|---|---|
| *H03K 5/153* | (2006.01) |
| *H03K 3/037* | (2006.01) |
| *G01R 31/54* | (2020.01) |
| *G01R 19/165* | (2006.01) |
| *H03K 5/24* | (2006.01) |

(52) U.S. Cl.
CPC ..... *H03K 3/0372* (2013.01); *G01R 19/16576* (2013.01); *G01R 31/54* (2020.01); *H03K 5/24* (2013.01)

(58) Field of Classification Search
CPC ........ H03K 5/2481; H03K 5/249; H03K 5/08; H03K 5/24; G01R 19/16519
USPC .......................................................... 327/77
See application file for complete search history.

(56) References Cited

U.S. PATENT DOCUMENTS

| | | | | |
|---|---|---|---|---|
| 2007/0028127 A1* | 2/2007 | Kim | ..................... | G06F 11/1443 713/310 |
| 2012/0023344 A1* | 1/2012 | Miyanaga | .............. | H03K 5/082 713/310 |
| 2018/0026461 A1* | 1/2018 | Rich | .................... | H02J 7/00036 320/106 |
| 2018/0088067 A1* | 3/2018 | Gupta | ..................... | G01R 31/69 |
| 2019/0066938 A1* | 2/2019 | Ishida | ..................... | B60R 16/03 |
| 2020/0319675 A1* | 10/2020 | Beckham | .............. | H02M 3/158 |

\* cited by examiner

*Primary Examiner* — Quan Tra
(74) *Attorney, Agent, or Firm* — Scully, Scott, Murphy & Presser, P.C.

(57) ABSTRACT

Systems and methods for detecting an open condition in a master-slave configuration are described. In an example, a controller can be integrated in a slave device of a master-slave configuration. The controller can be configured to activate a current source to supply a current to a pin of the slave device. The controller can be further configured to compare a voltage measured at the pin of the slave device with a reference voltage. The controller can be further configured to, based on the comparison, determine a presence or an absence of an open condition associated with the pin of the slave device. The controller can be further configured to output a signal representing the determination of the presence or the absence of the open condition to a master device.

17 Claims, 7 Drawing Sheets

25

OPEN CONDITION SENSING AND PROTECTION

FIELD OF THE DISCLOSURE

This disclosure relates to sensing and protecting an electronic component from an open condition. More specifically, this disclosure relates to an electronic component with an internal open sensing circuit which senses an open condition and reports the same to an external electronic component.

BACKGROUND

Different electronic components may be connected to each other in different configurations, such as a master-slave configuration. A master-slave configuration is where one electronic component, such as a master device, controls another electronic component, such as a slave device. The master electronic component may be connected with the slave electronic component via a passive external network and respective connection points in the master and slave device or electronic components. In order for the master electronic component to properly control the slave electronic component, feedback information such as operating conditions of the slave electronic component may be fed back to the master electronic component, from the slave electronic component, via one or more connection points of the slave electronic component and the passive external network.

However, when there is an open condition associated with the one or more connection points used for the feedback, the feedback information may not be fed back to the master electronic component. Therefore, the master electronic component may not be able to use the feedback information to react and control the slave electronic component as needed. In some examples, the open condition associated with a connection point may be caused by broken wires and poor connections between the passive external network and the connection point, a loose pin (or terminal or lead), or faulty components within the external passive network. The poor connections may be a result of soldering defects or defects with circuit traces. Further, the open condition may lead to problems in a system such as thermal runaway and delivery of excessively high current, which can damage the slave electronic component and other components downstream of the slave electronic component.

SUMMARY

In an example, an apparatus for detecting an open condition in a master-slave configuration is generally described. The apparatus can include a controller integrated in a slave device. The controller can be configured to activate a current source to supply a current to a pin of the slave device. The controller can be further configured to compare a voltage measured at the pin of the slave device with a reference voltage. The controller can be further configured to, based on the comparison, determine a presence or an absence of an open condition associated with the pin of the slave device. The controller can be further configured to output a signal representing the determination of the presence or the absence of the open condition to a master device.

In an example, a system for detecting an open condition in a master-slave configuration is generally described. The system can include a slave device, and a master device connected to the slave device. The slave device can be configured to activate a current source to supply a current to the pin of the slave device. The slave device can be further configured to compare a voltage measured at the pin of the slave device with a reference voltage. The slave device can be further configured to, based on the comparison, determine a presence or an absence of an open condition associated with the pin of the slave device. The slave device can be further configured to output a signal representing the determination of the presence or the absence of the open condition to the master device.

In an example, an apparatus for detecting an open condition in a master-slave configuration is generally described. The apparatus can include a power converter, and a controller connected to the power converter. The controller can be configured to control the power converter. The controller can be further configured to, in response to a specific operating condition of the apparatus, activate a current source to supply a current to a pin of the apparatus. The controller can be further configured to compare a voltage measured at the pin of the apparatus with a reference voltage. The controller can be further configured to, based on the comparison, determine a presence or an absence of an open condition associated with the pin of the apparatus. The controller can be further configured to output a signal representing the determination of the presence or the absence of the open condition to a device external to the apparatus.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
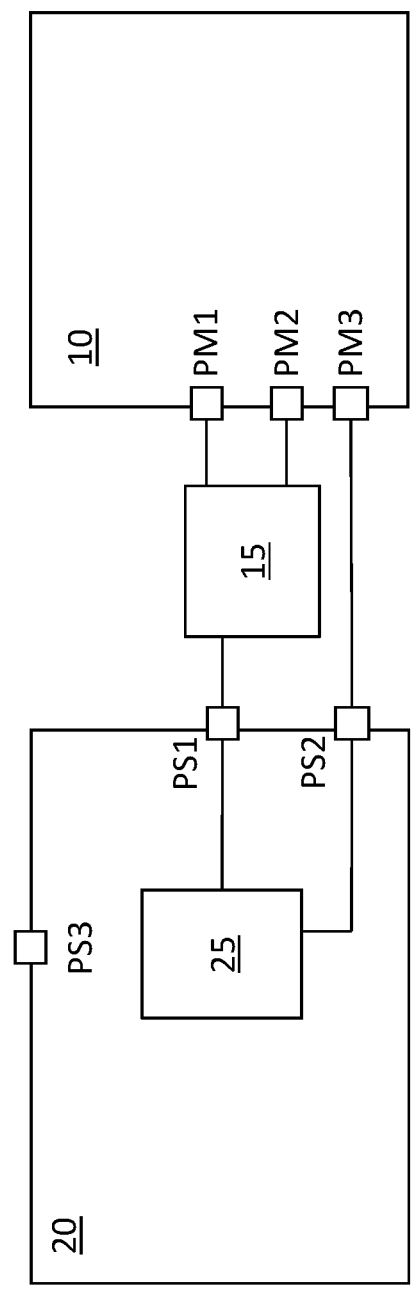
FIG. 1 illustrates a diagram of an example system that can implement open condition sensing and protection in accordance with aspects of the disclosure.

FIG. 1 illustrates a diagram of an example system 100 that can implement open condition sensing and protection in accordance with aspects of the disclosure. The term electronic component as used herein can include any discrete apparatus having input and output connection point(s) such as terminals, leads or pins used to affect electrons and its associated field. The electronic component may be in a package such as a semiconductor integrated circuit (IC). Multiple electronic components may be connected to each other to form the system 100 (or a part of the system 100). In some aspects of the disclosure, the system 100 may be a power system including converters such as DC-DC converters.

The system 100 can be a system having a master-slave configuration, where a master device (or electronic component) can control one or more slave devices (or electronic components). In the example shown in FIG. 1, the system 100 can include a master device 10, a slave device 20, and a passive external network 15 ("network 15"). The master device 10 can be connected to the slave device 20 via the network 15. In an example, the slave device 20 can be an integrated circuit (IC) being implemented as a power stage device or module. The master device 10 can be a controlling device such as controller being implemented as a digital multi-phase controller for a power stage device (e.g., the slave device 20). An example power stage device may include an integrated driver, a power converter having switching elements such as high side (or upper) and low side (or lower) metal-oxide-semiconductor field-effect transistors (MOSFETs) (e.g., a buck converter, or other types of DC-DC or power converters). In an example, the slave device 20 can be a smart power stage (SPS) configured to perform voltage regulation with additional features such as temperature and current feedback control.

In some examples, the master device 10 may control additional slave devices in addition to the slave device 20. In an example where the master device 10 controls multiple slave devices, the system 100 can further include one or more intermediate devices connected between the master device 10 and the multiple slave devices. An example of such intermediate devices can include a device configured to duplicate a drive signal (e.g., a pulse width modulation (PWM) signal) into two or more copies to drive or control multiple slave devices. It will be apparent to a person of ordinary skill in the art that the system 100 can include additional master devices (e.g., a dual master system), slave devices, and intermediate devices. Further, the methods and systems described herein can be applicable to other types of electronic components being implemented as slave devices.

In an example, the slave device 20 may be a current-sourced, voltage-sourced or both current and voltage-sourced device. A current-sourced slave device may be controlled by a constant input current outputted from a current source, where this constant input current can be independent of a voltage across the current source. A voltage-sourced slave device may be controlled by a constant voltage outputted from a voltage source. For current-sourced slave devices, the network 15 can be a low impedance resistor-capacitor (RC) network having a resistor and capacitor connected in parallel. For voltage-sourced slave devices, the network 15 can be a high impedance resistor-capacitor (RC) network. In examples where the slave device 20 is a voltage-sourced device, the master device 10 can be configured to detect presence of open conditions at connection points (e.g., where a connection point is opened or disconnected) or pins on the master device 10, the slave device 20, and within the network 15.

However, in examples where the slave device 20 is a current-sourced configuration device, the master device 10 may be configured to detect open conditions at its own pins, but not at the pins of the slave device 20 due to the network 15 being a low impedance RC network. In the example shown in FIG. 1, the slave device 20 is a current-sourced slave device and the network 15 is a low impedance RC network with a resistor and a capacitor connected in parallel. In order to detect open conditions at pins of a current-sourced slave device, such as the slave device 20 shown in FIG. 1, the slave device 20 can include an apparatus or a device 25 configured to perform open condition detection. The device 25 can be configured to detect open conditions between the master device 10, the slave device 20, and within the network 15, and perform protective functions in response to the detection of open conditions. For example, the device 25 can be configured to detect an open condition associated with a connection point (e.g., pins at the slave device 20) and report a result of the detection to another electronic component (e.g., master device 10).

The device 25 may be coupled to any connection point in the slave device 20 that may need protection against open conditions. The connection point that may need open condition detection may depend on the type of electronic component of the slave device 20, the passive external network 15, the master device 10, and application and desired implementations of the system 100. Note that FIG. 1 only shows a sub-set of connection points for the master device 10 and the slave device 20. For example, as shown, there are three connection points or pins PS1, PS2, and PS3 for the slave device 20, where the pin PS1 can be assigned or configured to be a connection point under open condition detection, the pin PS2 can be assigned or configured to report the open condition detection to, for example, the master device 10, and the pin PS3 can be assigned or configured for receiving an input voltage or supply voltage. It will be apparent to a person of ordinary skill in the art that the master device 10 and the slave device 20 can include additional connection points or pins.

In an example, the device 25 may be connected to the pin PS1, where the pin PS1 can be a current monitoring (or current sensing) pin of the slave device 20. In an example, a current sensing pin can be responsible for sending or returning a feedback current to the master device 10. Depending on the specific manufacturer of the component, this connection point (pin) may be labeled as, for example, IMON or IOUT. The pin PS1 may be coupled to a current sense connection point of the master device 10 via the network 15. In the example shown in FIG. 1, the master device 10 can include connection points or pins PM1, PM2, and PM3, where the pins PM1 and PM2 can be connected to the pin PS1 of the slave device 20 via the network 15. The pin PM3 can be connected to the pin PS2 of the slave device 20, where the device 25 can report information relating to the open condition detection to the master device 10 from the pin PS2 to the pin PM3. Depending on the specific manufacturer of the component, the pin PM3 may be labeled EN by a manufacture of the master device 10, and the pins PM1 and PM2 may be labeled as, for example, CS and CSRTN, respectively.

Figure 2A:
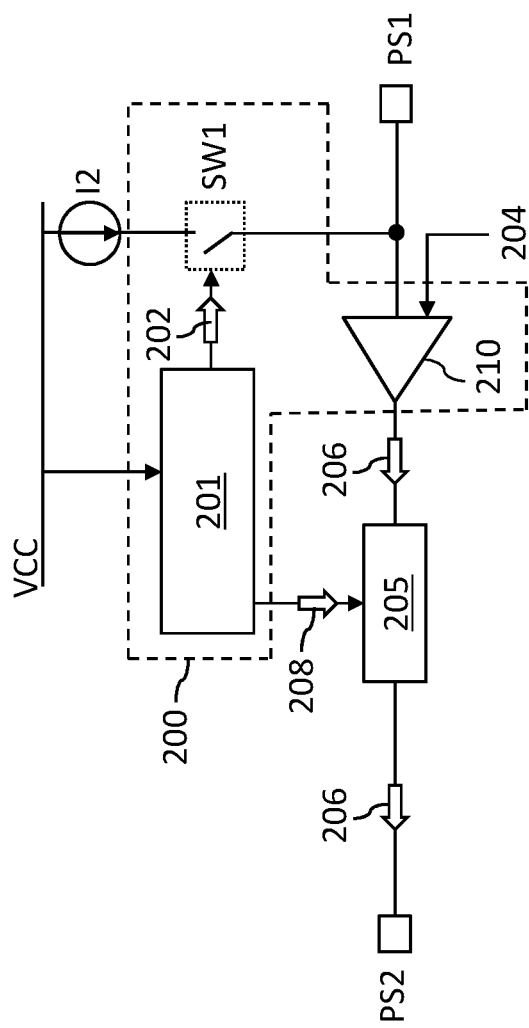
FIG. 2A illustrates a diagram of an example apparatus that can implement open condition sensing and protection in accordance with aspects of the disclosure.

FIG. 2A illustrates an example integrated circuit that can implement open condition sensing and protection in accordance with aspects of the disclosure. The example integrated circuit shown in FIG. 2A is the device 25 shown in FIG. 1. The device 25 can include a current source I2 connected in series with a switch SW1. In some examples, the current source I2 may be a transistor and the switch SW1 may be a metal-oxide-semiconductor field-effect transistor (MOSFET). The current source I2 and the switch SW1 may be coupled with a connection point subject to open condition detection by the device 25 (e.g., connection point PS1). The current source I2 can be connected to a voltage source VCC. The value of VCC may be based on a type of the slave device 20 shown in FIG. 1, and may be based on a desired application or implementation of the system 100 shown in FIG. 1. In some examples, VCC can be a bias voltage supply such as a 5 volts (V) supply.

The device 25 may further include a controller 200. The controller 200 can include logic gates and other electronic components that form a control logic block ("control logic") 201. The control logic 201 can generate various internal signals (e.g., signals that are not transmitted out of the control logic 201), where the internal signals can change state in response to various input signals. For example, the control logic 201 can monitor the supply voltage VCC and generate one or more internal signals in response to the supply voltage VCC reaching a specific level. Further, the control logic 201 can generate signals for other components in the controller 200 based on the states of the internal signals. For example, the control logic 201 can generate and output a control signal 202 based on the states of the internal signals, and the control signal 202 can be used to activate or deactivate the switch SW1. In response to activating the switch SW1, the current source I2 can supply the current I2 to the connection point subject to open condition detection (e.g., PS1). In an example, the control signal 202 may be supplied to a gate of the switch SW1 (e.g., a gate of a MOSFET).

The device 25 may also include a comparator 210. The comparator may be connected with the connection point PS1 subject to open condition detection. As shown in FIG. 2A, the comparator 210 can be a Schmitt trigger. However, other types of comparators may be used. In some examples, the control logic 201, the switch SW1, and the comparator 210 can form the controller 200. It will be apparent to a person of ordinary skill in the art that the controller 200 can include additional components not shown herein to implement the methods and systems described in accordance with the present disclosure.

One of the terminals of the comparator 210 can be connected with a reference voltage 204. Another terminal of the comparator 210 can be connected to the connection point or pin PS1. The comparator 210 can compare the reference voltage 204 with a voltage associated with the connection point PS1 (e.g., measured at the connection point PS1) and output a signal 206 that represents a comparison result. In response to the voltage associated with PS1 being less than the reference voltage 204, the comparator 210 can output the signal 206 having a first value. In response to the voltage associated with PS1 being greater than the reference voltage 204, the comparator 210 can output the signal 206 having a second value. In an example, the first value may be a logical HIGH and the second value may be a logical LOW, or vice versa. Further, the voltage associated with the connection point PS1 being greater than the reference voltage 204 can indicate a presence of an open connection at the connection point PS1.

The device 25 may also include a flip-flop 205. The flip-flop 205 can be, for example, a set-reset (SR) latch, or other types of latches. In an example embodiment, an output terminal of the flip-flop 205 can be connected to connecting point PS2 of the slave device 20. The signal 206 can be transmitted from the comparator 210 to an input terminal of the flip-flop 205. The flip-flop 205 can latch the signal 206 (e.g., lock the signal 206 in a certain state, such as binary zero or binary one, until a clock signal or a control signal changes the state). The flip-flop 205 can forward the signal 206 to the pin PS2. In an example, the state of the signal 206 latched in the flip-flop 205 can be maintained until a change occurs. For example, the control logic 201 can output a control signal 208 to change a state being latched by the flip-flop 205. If an open condition is detected at the pin PS1, the state of the signal 206 is HIGH. The HIGH state can be latched in the flip-flop 205, and in response to the detected open condition being resolved, the control logic 201 can output the control signal 208 to toggle the latched state in the flip-flop 205 to LOW.

In some examples, the reference voltage 204, the value of the current I2, and a setup time of the flip-flop 205 may be a function of one or more of the voltage VCC and/or the parameter values (e.g., resistance, capacitance, etc.) of the component of the network 15 shown in FIG. 1. For example, the setup time of the flip-flop 205 may increase as the value of a capacitor in the network 15 increases to insure accurate detection of open conditions. However, the setup time of the flip-flop 205 may be shortened when the current I2 is increased.

In some aspects of the disclosure, the detection of an open condition can be triggered by a power-on reset (POR) of the slave device 20 or for a component of the slave device 20. For example, in response to the POR of the slave device 20, the control logic 201 can send the control signal 202 to activate (e.g., close) the switch SW1 to supply the current I2 to the comparator 210 and the pin PS1. In another example, the control logic 201 can be configured to detect the supply voltage VCC, and in response to an increase in the supply voltage VCC (e.g., ramp up), send the control signal 202 to activate (or close) the switch SW1 in order to supply the current I2 to the comparator 210 and the pin PS1. In some aspects of the disclosure, the detection of an open condition can be performed by the device 25 periodically, under a test mode of the slave device 20, or by a user input.

In an example, the control logic 201 can generate a plurality of internal signals, such as signals that are exchanged within the control logic 201 and may not be transmitted outside of the control logic 201. These internal signals can be toggled or pulled to logical HIGH or LOW (e.g., HIGH can be represented by one voltage level and LOW can be represented by another voltage level) by various logic gates or circuit components within the control logic 201, and in response to particular conditions such as particular states of the internal signals.

For example, in response to the VCC increasing to a particular level, the control logic 201 can generate an internal enable signal that can enable a logic gate or component within the control logic 201 to pull the control signal 202 HIGH, in order to close the switch SW1 to supply the current I2. An example component can be, for example, a comparator within in the control logic 201 that can compare the VCC with a reference voltage or a predetermined voltage in order to determine whether the VCC is exceeding a particular level.

In another example, the flip-flop 205 can be used for controlling a duration in which the current I2 is being supplied to the comparator 210 and the pin PS1 (and any pin that may be subject to open condition detection). For example, in response to activating the switch SW1, the control logic 201 can generate an internal delay signal to pull the control signal 208 HIGH in order for the flip-flop 205 to latch the signal 206 from the comparator 210. In an example embodiment, the control logic 201 can detect that the flip-flip 205 has successfully latched and, in response, deactivate or open the switch SW1 to stop the supply of the current I2. In another example embodiment, the control logic 201 can detect that the flip-flip 205 has successfully latched and, in response, allow the switch SW1 to remain closed or activated to provide a continuous open condition monitoring (e.g., not triggered by particular conditions), as long as the current I2 flowing through SW1 does not create noticeable error during operation of the slave device 20. Note that since the state or value of the signal 206 latched by the flip-flop 205 can remain the same even though the switch SW1 is opened, since opening the switch SW1 does not change to the detected open condition. In an example, the controller 200 can be programmed to generate the internal delay signal to open the switch SW1 after a predetermined amount of time has lapsed, in order to control a duration to supply the current I2.

In other aspects of the disclosure, the detection of an open condition may be triggered by a signal from an external device, such as the master device 10 or a scheduler (or a sequencer). The sequencer may be an external device configured to determine an order of operation of multiple slave devices (including the slave device 20). In this aspect of the disclosure, the signal may be received via one of the connection points or pins of the slave electronic component 20.

Figure 2B:
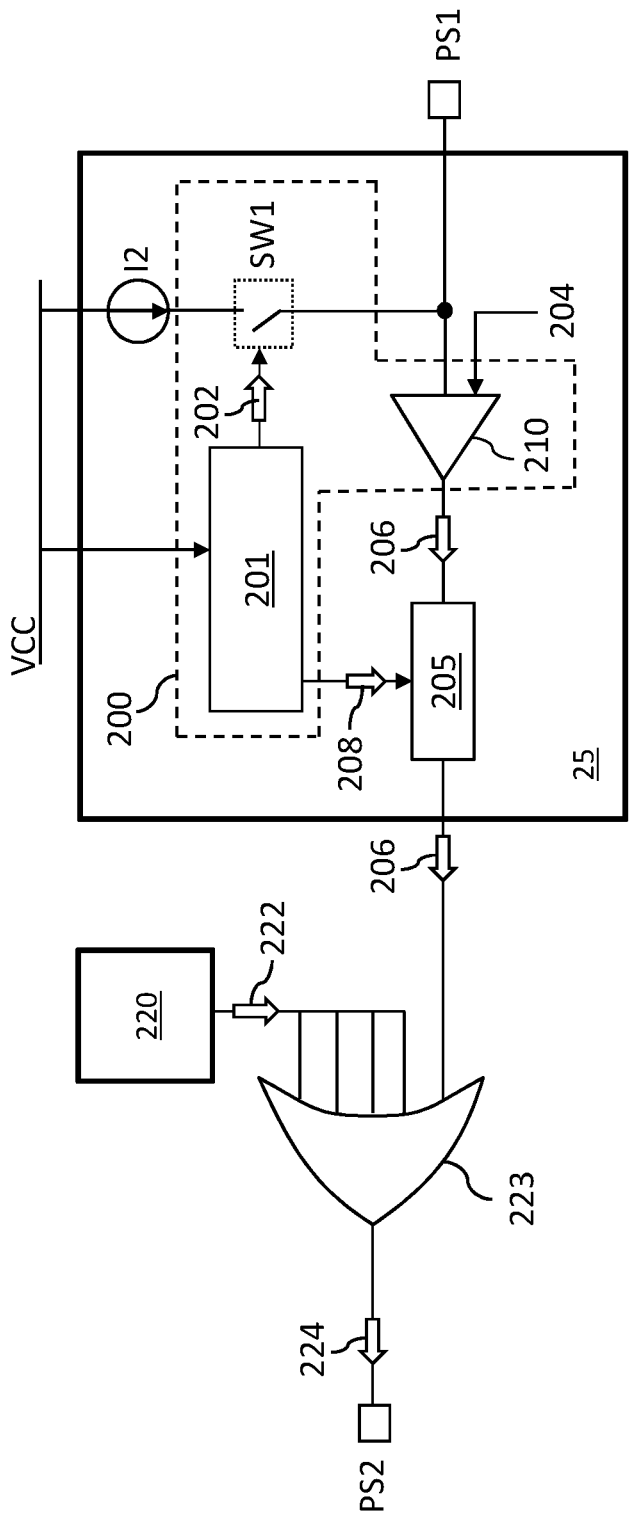
FIG. 2B illustrates an example implementation of the example apparatus shown in FIG. 2A in accordance with aspects of the disclosure.

FIG. 2B illustrates an example implementation of the example apparatus shown in FIG. 2A in accordance with aspects of the disclosure. In the example shown in FIG. 2B, the apparatus or device 25 can be connected to a fault detection circuit 220 in the slave device 20. The fault detection circuit 220 can include a plurality of circuit components that can detect various types of errors or faults associated with the slave device 20. Some examples of faults can include, but not limited to, errors in current, temperature, I/O voltage, and other types of errors or fault events and fault conditions of the slave device 20. In the example shown in FIG. 2B, the fault detection circuit 220 of the slave device 20 can output a fault signal 222, where the fault signal 222 can indicate an occurrence of one or more faults detected by the fault detection circuit 220. The fault signal 222 can be inputted to an OR gate 223, such as in response to a presence of at least one fault associated with the slave device 20, the OR gate 223 can output a signal 224 with a HIGH or binary one value representing the presence of at least one fault.

In an example, the fault detection circuit 220 and the OR gate 223 can be embedded in the slave device 20 to implement a fault detection system. The device 25 can be added to, or embedded in, the slave device 20 by being combined with this fault detection system via the OR gate 223. For example, the output of the flip-flop 205 can be connected to one of the input pins or terminal of the OR gate 223. Thus, the OR gate 223 can receive the fault signal 222 and the signal 206, while considering the open condition indicated by the signal 206, as one of fault conditions associated with the slave device 20. For example, if the fault detection circuit 220 does not detect any fault (e.g., signal 222 has a LOW value or binary zero), but the signal 206 indicates an open condition, then the OR gate 223 can output the signal 224 having a HIGH value to indicate at least one fault (e.g., an open condition) is present. The signal 224 can be sent to the master device 10 via the pin PS2.

As shown by the example in FIG. 2B, the device 25 can be added to an existing fault detection system in a slave device without modifying existing hardware of the slave device. Further, such addition can avoid additional reprogramming of firmware or software of the system 100. For example, the master device 10 can be programmed to perform protective procedures in response to the signal 224 indicating a fault. The addition of the device 25 to send the signal 206 to the OR gate 223 does not affect how the master device 10 may be triggered to perform protective measures.

Figure 3:
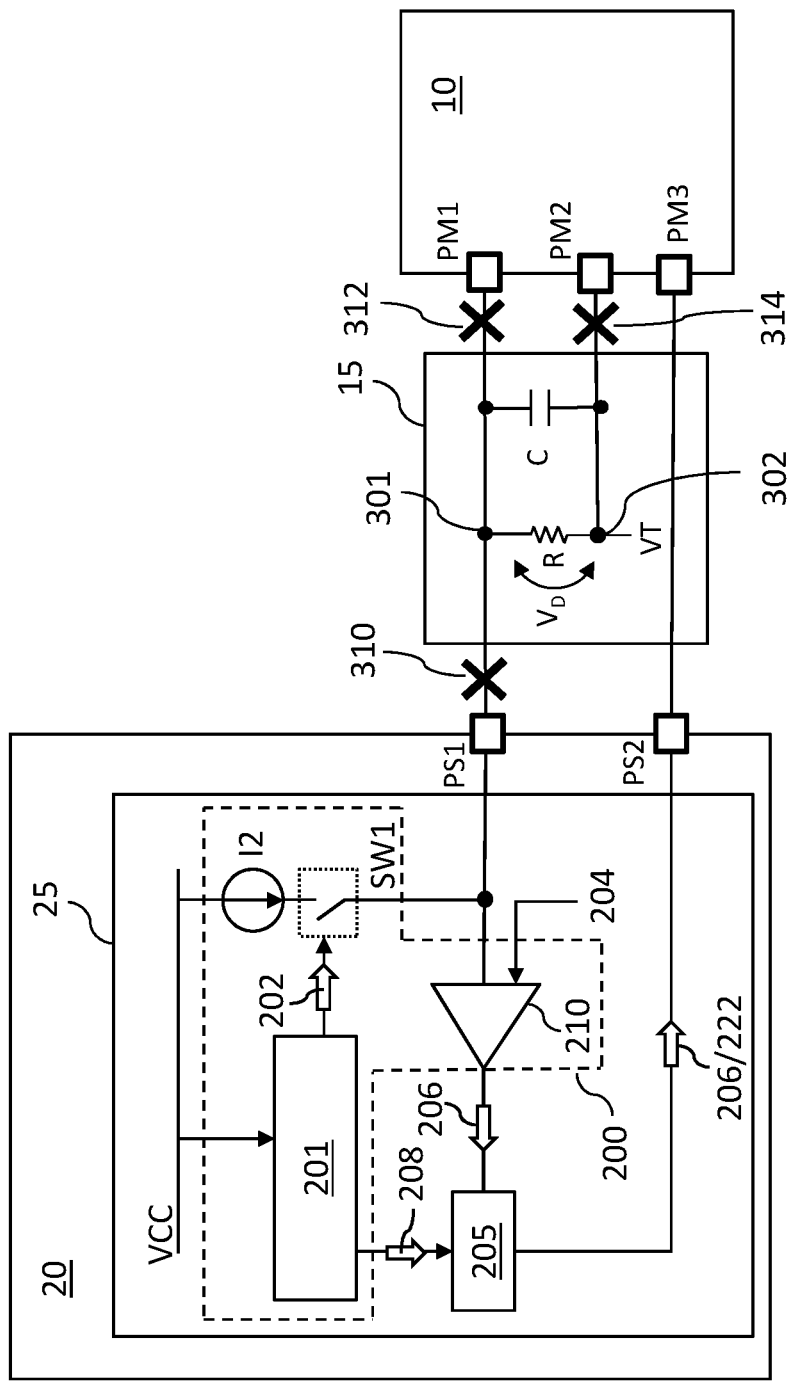
FIG. 3 illustrates additional details of the example system shown in FIG. 1 in accordance with aspects of the disclosure.

FIG. 3 illustrates additional details of the example system 100 shown in FIG. 1 in accordance with aspects of the disclosure. In the example shown in FIG. 3, open conditions can occur at connection points between the slave device 20 and the network 15 (e.g., connection point 310), connection points between the network 15 and the master device 10 (e.g., connection points 312 and 314), or connection points within the network 15 (e.g., connection points 301, 302). The device 25 within the slave device 20 can be configured to detect a presence of open conditions at connection points between the slave device 20 and the network 15 or connection points in the network 15 (e.g., between pin PS1 and the connection point 302). Note that the slave device 20 shown in FIG. 3 can be a current-sourced slave device, and the network 15 shown in FIG. 3 can be a low impedance RC network with a resistor R and a capacitor C connected in parallel. However, it will be apparent to a person of ordinary skill in the art that the device 25 may also be used for detecting open conditions in a voltage-sourced configuration and hybrid current-sourced and voltage-sourced configurations.

In an example, to detect open condition at the connection point 310, the device 25 can activate the current source I2 to supply the current I2 to the pin PS1. If there is no open condition at the connection point 310, a voltage measured at the pin PS1 can be the voltage drop $V_D$ across the resistor R (e.g., $V_D$=I2×R). In an example, if R=1 kilo-ohms (kΩ) and I2=30 microamperes (μA), then $V_D$ can be 30 millivolts (mV). If there is an open condition at the connection point 310, the current I2 cannot flow beyond the connection point 310, and the voltage measured at the pin PS1 can be significantly higher without the voltage drop across the resistor R. For example, if the reference voltage 204 is set to 2V, then the voltage drop $V_D$=30 mV across the resistor can be less than the reference voltage 204, and the comparator 210 can output the signal 206 having a value that indicates there is no open condition at the connection point 310. However, if the voltage measured at the pin PS1 is greater than the reference voltage 204 in the case where there is an open condition at the connection point 310, due to the lack of voltage drop across the resistor R, then the comparator 210 can output the signal 206 having a value that indicates a presence of an open condition at the connection point 310.

The master device 10 shown in FIG. 3 may include its own open condition detection circuit(s) configured to detect open connections connected to its pins, such as connection points between PM1 and connection 302 or between PM2 and the connection point 301. However, as described above, the open condition detection circuits in the master device 10 may not be configured to detect the open conditions or connections associated with a current-sourced slave device, such as the slave device 20 shown in FIG. 3. For example, the master device 10 may not be able to detect open connections between pin PS1 and connection point 302, such as at the connection point 310. For example, if there is an open condition at the connection point 310, the master device 10 can still force a current to flow through the resistor R, causing a voltage at the pin PM1 or PM2 to be the voltage drop $V_D$. Thus, the master device 10 may not be able to detect an open condition at the connection point 310. By adding or embedding the device 25 in the slave device 20, the system 100 can be implemented with open condition detection on both ends (e.g., the master side and the slave side) of a master-slave configuration that has a current-sourced slave device.

For example, in some aspects of the disclosure, the device 25 as described above may be connected to multiple connection points in the slave device 20, such as connection points that receive the reference voltage 204, the supply voltage VCC, and/or other voltages from external voltage sources. Other pins that can be connected to the device 25 can include the pin PS2 being used to report a result of the open condition detection to the master device 10 (at the pin PM3 of the master device 10).

In an example the device 25 can output the signal 206 to the master device 10 from the pin PS2 to the pin PM3. In response to the signal 206 having a value representing a presence of open connection, the master device 10 may initiate a protection procedure. For example, the master device 10 may stop driving or controlling the slave device 20. In other aspects of the disclosure, the master device 10 may cause the slave device 20 to be disconnected from other components of the system, such as the other components of a DC-DC converter, server, networking device and cloud computing system. In other aspects of the disclosure, the master device 10 may stop power (e.g., disconnect VCC) from being supplied to the slave device 20. In other aspects of the disclosure, the master device 10 may drive the slave device 20 at a reduced percentage or a portion of its rating. In examples where the master device 10 controls more than one slave devices (e.g., slave devices in addition to the slave device 20), the master device can perform the above-mentioned protection procedures to the slave device 20 in response to detecting an open condition associated with the slave device 20, to one or more of the additional slave devices, or to all of the slave devices being controlled by the master device 10.

Figure 4:
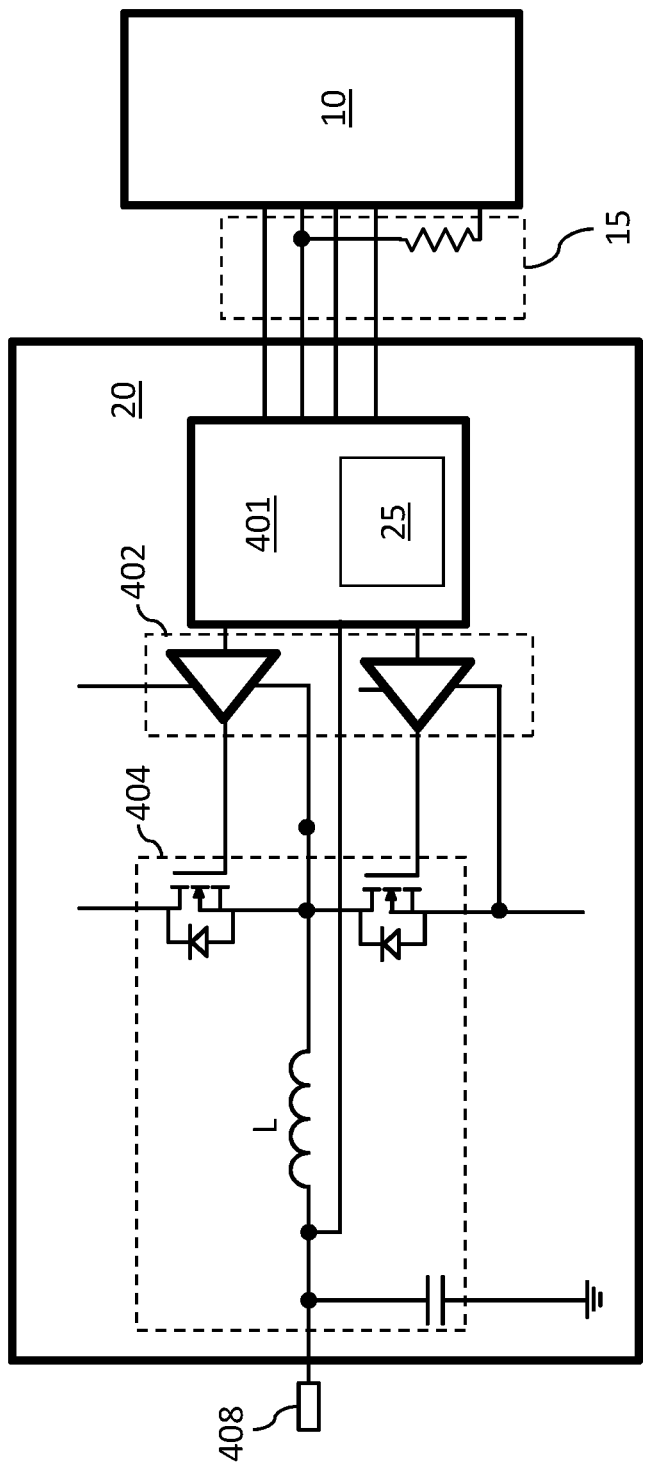
FIG. 4 illustrates a diagram of another example system that can implement open condition sensing and protection in accordance with aspects of the disclosure.

FIG. 4 illustrates a diagram of another example system 400 that can implement open condition sensing and protection in one embodiment. In the example shown in FIG. 4, the system 400 can be a power or voltage regulation system for regulating power to a load 408. The system 400 can include the master device 10, the slave device 20, and the network 15, similar to the system 100 shown in FIG. 1. The slave device 20 can be a smart power stage (SPS) including an integrated driver 402, a power converter 404 having switching elements such as a high side (or upper) MOSFET and a low side (or lower) MOSFET, and a control module or controller 401. The controller 401 can be configured to control and monitor operating conditions of the power converter 404. The controller 401 can be further configured to perform feedback control based on operating conditions of the power converter 404. For example, the controller 401 can be configured to monitor temperature, current, and other faults of the power converter 404 or the slave device 20, and report the detected faults back to the master device 10. In an example, the control module 401 can include the fault detection circuit 220 shown in FIG. 2B. The master device 10 can be a digital multi-phase controller for a power stage device (e.g., the slave device 20). The master device 10 can be connected to the slave device 20 via the network 15.

The device 25 can be integrated in the control module 401 of the slave device 20. The device 25 can be configured to perform open condition detection in response to specific operating conditions of the power converter 404. By integrating the device 25 in the slave device 20, the slave device 20 can be configured to detect open conditions between the slave device 20 and the network 15, and in particular portions of the network 15. The master device 10 can be configured to detect open conditions between the master device 10 and the network 15, and in other portions of the network 15. Therefore, the system 400 can be implemented as a power or voltage regulation system with open condition sensing or detection.

Figure 5:
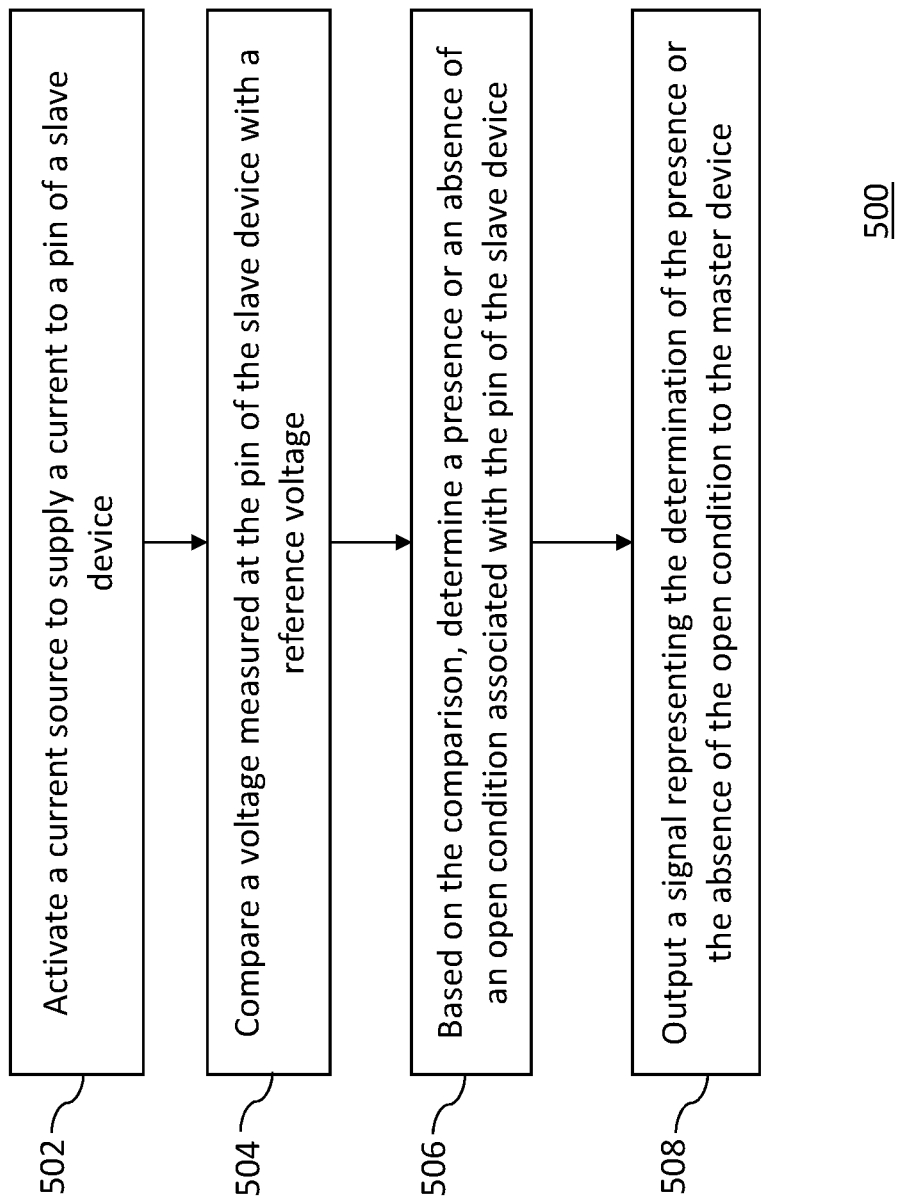
FIG. 5 is a flow diagram illustrating a process of implementing open condition sensing and protection in one embodiment.

FIG. 5 is a flow diagram illustrating a process 500 to implement open condition sensing and protection in one embodiment. The process can include one or more operations, actions, or functions as illustrated by one or more of blocks 502, 504, 506, and/or 508. Although illustrated as discrete blocks, various blocks can be divided into additional blocks, combined into fewer blocks, eliminated, or performed in parallel, depending on the desired implementation.

The process 500 can begin at block 502. At block 502, an open condition detection circuit (e.g., device 25 shown in FIG. 1 to FIG. 4) can activate a current source to supply a current to a pin of a slave device in a system implementing a master-slave configuration. The system can be a power regulation system and the slave device can be a power regulator including a power converter. The slave device can be connected to a master device, and the master device can control and monitor operations of the slave device. In some examples, the slave device can be a current-sourced device. In some examples, the controller can activate the current source in response to one of a power-on reset (POR) on the slave device and a supply voltage to the slave device increasing to a particular level.

The process 500 can proceed from block 502 to block 504. At block 504, the open condition detection circuit can compare a voltage measured at the pin of the slave device with a reference voltage. The reference voltage can be lower than the supply voltage. In some examples, the open condition detection circuit can include a comparator configured to compare the voltage measured at the pin of the slave device with the reference voltage.

The process 500 can proceed from block 504 to block 506. At block 506, the open condition detection circuit can, based on the comparison, determine a presence or an absence of an open condition associated with the pin of the slave device. In response to the voltage measured at the pin of the slave device being less than the reference voltage, the open condition detection circuit can determine that the open condition is absent. In response to the voltage measured at the pin of the slave device being greater than the reference voltage, the open condition detection circuit can determine that the open condition is present.

The process 500 can proceed from block 506 to block 508. At block 508, the open condition detection circuit can output a signal representing the determination of the presence or the absence of the open condition to the master device. In some examples, the open condition detection circuit can include a flip-flop configured to latch the signal representing the determination of the presence or the absence of the open condition. The open condition detection circuit can deactivate the current source in response to the flip-flop latching the signal.

Figure 6:
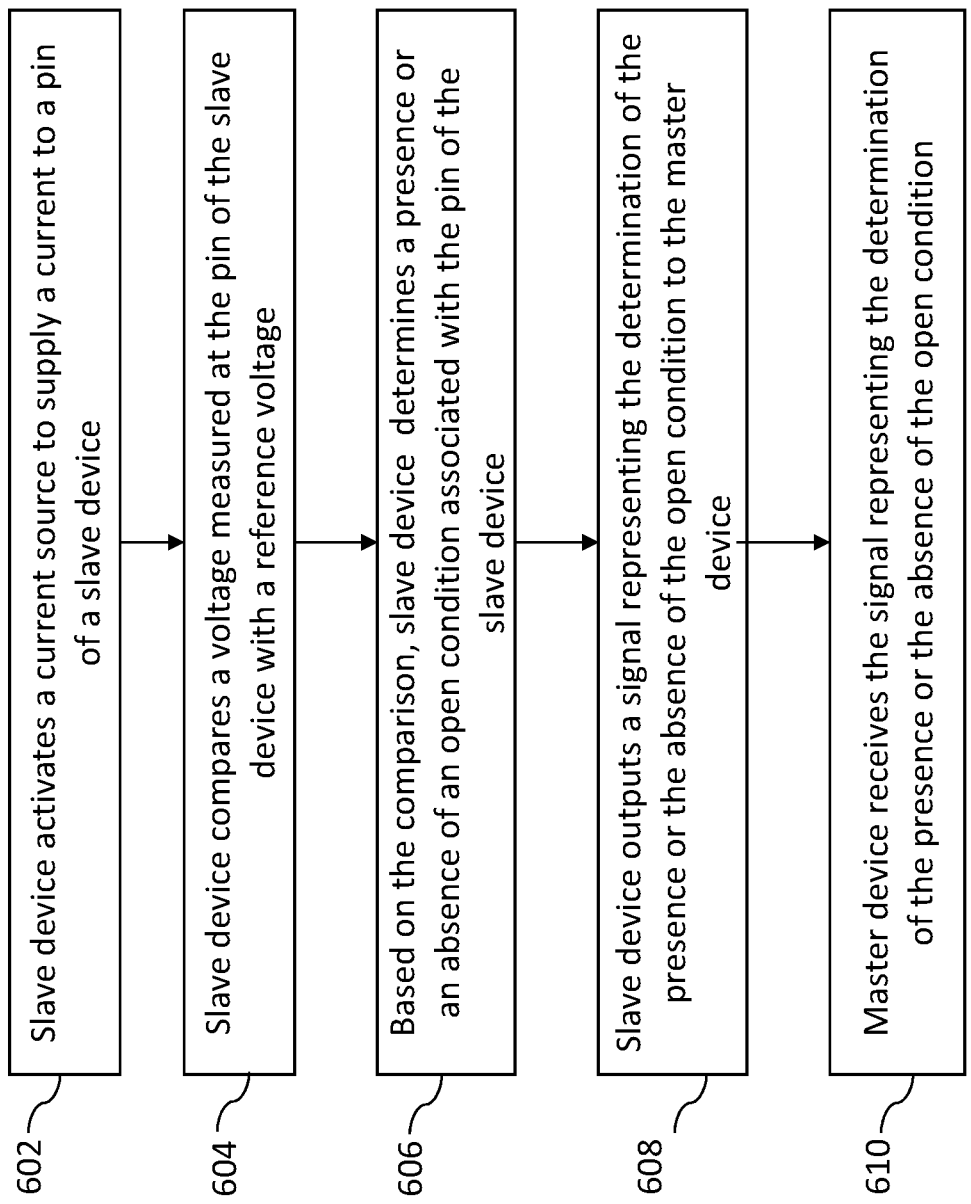
FIG. 6 is a flow diagram illustrating a process of implementing open condition sensing and protection in one embodiment.

FIG. 6 is a flow diagram illustrating a process 600 to implement open condition sensing and protection in one embodiment. The process can include one or more operations, actions, or functions as illustrated by one or more of blocks 602, 604, 606, and/or 608. Although illustrated as discrete blocks, various blocks can be divided into additional blocks, combined into fewer blocks, eliminated, or performed in parallel, depending on the desired implementation.

The process 600 can begin at block 602. At block 602, a slave device can activate a current source to supply a current to a pin of the slave device in a system implementing a master-slave configuration. The system can be a power regulation system and the slave device can be a power regulator including a power converter. The slave device can be connected to a master device, and the master device can control and monitor operations of the slave device. The master device and the slave device can be connected to one another via a network including a resistor and a capacitor. The network can be a low impedance network where the resistor and the capacitor are connected in parallel. In some examples, the slave device can be a current-sourced device. In some examples, the controller can activate the current source in response to one of a power-on reset (POR) on the slave device and a supply voltage to the slave device increasing to a particular level.

The process 600 can proceed from block 602 to block 604. At block 604, the slave device can compare a voltage measured at the pin of the slave device with a reference voltage. The reference voltage can be lower than the supply voltage. In some examples, the slave device can include a comparator configured to compare the voltage measured at the pin of the slave device with the reference voltage.

The process 600 can proceed from block 604 to block 606. At block 606, the slave device can, based on the comparison, determine a presence or an absence of an open condition associated with the pin of the slave device. In response to the voltage measured at the pin of the slave device being less than the reference voltage, the slave device can determine that the open condition is absent. In response to the voltage measured at the pin of the slave device being greater than the reference voltage, the slave device can determine that the open condition is present.

The process 600 can proceed from block 606 to block 608. At block 608, the slave device can output a signal representing the determination of the presence or the absence of the open condition to the master device. In some examples, the slave device can include a flip-flop configured to latch the signal representing the determination of the presence or the absence of the open condition. The slave device can deactivate the current source in response to the flip-flop latching the signal.

The process 600 can proceed from block 608 to block 610. At block 610, the master device can receive the signal representing the determination of the absence or presence of the open condition. In response to the signal indicating an absence of the open condition, the master device can continue to operate and control the slave device without interruption. In response to the signal indicating that the open condition is present, the master device can perform various protective measures for the system. For example, the master device can stop a control of the slave device, disconnect the slave device from another component, stop a supply of power to the slave device, and/or reduce a power being used to drive the slave device.

In some examples, the slave device can include a fault detection circuit. The signal representing the determination of the presence or the absence of the open condition can be outputted to the fault detection circuit. The fault detection circuit can be configured to output a fault signal to the first device in response to the signal indicating a presented of the open condition.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a controller integrated in a slave device,
   wherein the slave device is connected to a master device via a network, where the network is a low impedance network comprising a resistor and a capacitor connected in parallel, and
   wherein the controller is configured to:
      activate a current source to supply a current to a pin of the slave device;
      compare a voltage measured at the pin of the slave device with a reference voltage;
      based on the comparison, determine a presence or an absence of an open condition between the slave device and the network, the open condition being associated with the pin of the slave device;
      output a signal representing the determination of the presence or the absence of the open condition to a master device; and
      control a power converter in response to the master device performing, after receiving the signal, at least one of stop a control of the slave device, disconnect the slave device from another component, stop a supply of power to the slave device and reduce a power being used to drive the slave device.

2. The apparatus of claim 1, wherein the slave device is a current-sourced device.

3. The apparatus of claim 1, wherein the controller is configured to activate the current source in response to one of:
a power-on reset (POR) on the slave device; and
a supply voltage to the slave device increasing to a particular level.

4. The apparatus of claim 1, wherein the controller is configured to:
in response to the voltage measured at the pin of the slave device being less than the reference voltage, determine that the open condition is absent; and
in response to the voltage measured at the pin of the slave device being greater than the reference voltage, determine that the open condition is present.

5. The apparatus of claim 1, further comprising a flip-flop configured to latch the signal representing the determination of the presence or the absence of the open condition,
wherein the controller is configured to deactivate the current source in response to the flip-flop latching the signal.

6. The apparatus of claim 1, wherein the controller further comprises a comparator configured to compare the voltage measured at the pin of the slave device with the reference voltage.

7. A system comprising:
a master device; and
a slave device,
wherein the slave device is connected to the master device via a network, where the network is a low impedance network comprising a resistor and a capacitor connected in parallel, and
wherein the slave device is configured to:
activate a current source to supply a current to a pin of the slave device;
compare a voltage measured at the pin of the slave device with a reference voltage;
based on the comparison, determine a presence or an absence of an open condition between the slave device and the network, the open condition being associated with the pin of the slave device;
output a signal representing the determination of the presence or the absence of the open condition to the master device; and
control a power converter in response to the master device performing, after receiving the signal, at least one of stop a control of the slave device, disconnect the slave device from another component, stop a supply of power to the slave device and reduce a power being used to drive the slave device.

8. The system of claim 7, wherein the slave device is a current-sourced device.

9. The system of claim 7, wherein the slave device is configured to activate the current source in response to one of:
a power-on reset (POR) on the slave device; and
a supply voltage to the slave device increasing to a particular level.

10. The system of claim 7, wherein the slave device is configured to:
in response to the voltage measured at the pin of the slave device being less than the reference voltage, determine that the open condition is absent; and
in response to the voltage measured at the pin of the slave device being greater than the reference voltage, determine that the open condition is present.

11. The system of claim 7, wherein the slave device further comprises a flip-flop configured to latch the signal representing the determination of the presence or the absence of the open condition, and the slave device is configured to deactivate the current source in response to the flip-flop latching the signal.

12. The system of claim 7, wherein the slave device further comprises a comparator configured to compare the voltage measured at the pin of the slave device with the reference voltage.

13. The system of claim 7, wherein:
the slave device further comprises a fault detection circuit;
the signal representing the determination of the presence or the absence of the open condition is outputted to the fault detection circuit; and
the fault detection circuit is configured to output a fault signal to the master device in response to the signal representing the determination of the presence of the open condition.

14. An apparatus comprising:
a power converter; and
a controller connected to a master device via a network, where the network is a low impedance network comprising a resistor and a capacitor connected in parallel,
wherein the controller is configured to:
in response to a specific operating condition of the apparatus:
activate a current source to supply a current to a pin of the apparatus;
compare a voltage measured at the pin of the apparatus with a reference voltage;
based on the comparison, determine a presence or an absence of an open condition between the apparatus and the network, the open condition being associated with the pin of the apparatus;
output a signal representing the determination of the presence or the absence of the open condition to a device external to the apparatus; and
control the power converter in response to the master device performing, after receiving the signal, at least one of stop a control of the apparatus, disconnect the apparatus from another component, stop a supply of power to the apparatus and reduce a power being used to drive the apparatus.

15. The apparatus of claim 14, wherein the controller is configured to:
in response to the voltage measured at the pin of the apparatus being less than the reference voltage, determine that the open condition is absent; and
in response to the voltage measured at the pin of the apparatus being greater than the reference voltage, determine that the open condition is present.

16. The apparatus of claim 14, further comprising a fault detection circuit, wherein the controller is further configured to:
output the signal representing the determination of the presence or the absence of the open condition to the fault detection circuit; and
the fault detection circuit is configured to output a fault signal to the device external to the apparatus in response to the signal indicating a presented of the open condition.

17. The apparatus of claim 14, further comprising a flip-flop configured to latch the signal representing the determination of the presence or the absence of the open condition, wherein the controller is configured to deactivate the current source in response to the flip-flop latching the signal.

\* \* \* \* \*